United States Patent [19]

Yamada et al.

[11] Patent Number: 5,112,719
[45] Date of Patent: May 12, 1992

[54] POSITIVE RESIST COMPOSITION CONTAINING ALKALI-SOLUBLE PHENOLIC RESIN, QUINONEDIAZIDE SULFONIC ACID ESTER PHOTOSENSITIVE AGENT AND POLYHYDROXY SENSITIZER

[75] Inventors: Takamasa Yamada, Komaki; Shoji Kawata, Kawasaki; Masayuki Oie, Kamakura, all of Japan

[73] Assignee: Nippon Zeon Co., Ltd., Japan

[21] Appl. No.: 603,355

[22] Filed: Oct. 26, 1990

[30] Foreign Application Priority Data

Dec. 28, 1989 [JP] Japan .................................. 1-342193

[51] Int. Cl.$^5$ ........................ G03F 7/023; G03C 1/61
[52] U.S. Cl. .................................. 430/191; 430/165; 430/190; 430/192; 430/193
[58] Field of Search ................ 430/191, 196, 193, 192

[56] References Cited

U.S. PATENT DOCUMENTS

| | | | |
|---|---|---|---|
| 3,188,210 | 6/1965 | Fritz et al. | 430/193 |
| 4,115,128 | 9/1978 | Kita | 430/191 |
| 4,365,019 | 12/1982 | Daly et al. | 430/190 |
| 4,626,492 | 12/1986 | Eilbeck | 430/191 |
| 4,983,492 | 1/1991 | Trefonas, III et al. | 430/193 |

FOREIGN PATENT DOCUMENTS 0337426 10/1989 European Pat. Off. .

OTHER PUBLICATIONS

Yamjima, Patent Abstracts of Japan, vol. 13, No. 75 (P-831) (3423) published Feb. 21, 1989.

Primary Examiner—Charles L. Bowers, Jr.
Assistant Examiner—Christopher G. Young
Attorney, Agent, or Firm—Lowe, Price, LeBlanc & Becker

[57] ABSTRACT

Disclosed herein is a positive resist composition comprising an alkali-soluble phenolic resin, a photosensitive agent formed of a quinonediazide sulfonic acid ester and at least one compound represented by the following general formula (I):

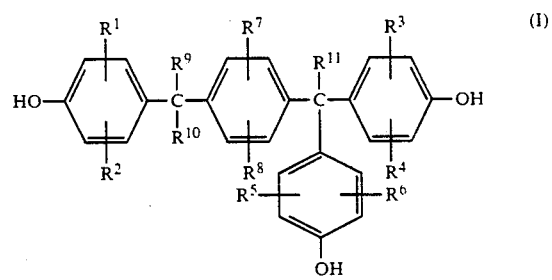

wherein
 $R^1$ through $R^6$ mean individually a hydrogen or halogen atom, a hydroxyl group or an alkyl or alkenyl group having 1-4 carbon atoms and may be equal to or different from one another,
 $R^7$ and $R^8$ denote individually a hydrogen or halogen atom, or an alkyl group having 1-4 carbon atoms and may be equal to or different from each other, and
 $R^9$ through $R^{11}$ stand individually for a hydrogen atom or an alkyl group having 1-4 carbon atoms and may be equal to or different from one another. It is suitable for use in minute processing.

1 Claim, No Drawings

POSITIVE RESIST COMPOSITION CONTAINING ALKALI-SOLUBLE PHENOLIC RESIN, QUINONEDIAZIDE SULFONIC ACID ESTER PHOTOSENSITIVE AGENT AND POLYHYDROXY SENSITIZER

FIELD OF THE INVENTION

The present invention relates to a positive resist composition, and more specifically to a positive resist composition suitable for use in minute processing required for the fabrication of semiconductor devices, magnetic bubble memory devices, integrated circuits and the like.

BACKGROUND OF THE INVENTION

Upon the fabrication of a semiconductor, a semiconductor device is formed by a lithography technique in which a resist is applied on the surface of a silicon wafer to form a photosensitive film, the film is exposed to light so as to form a latent image and the latent image is then developed to form a negative or positive image.

A negative resist composed of cyclized polyisoprene and a bisazide compound has heretofore been known as a resist composition for the fabrication of semiconductor devices. However, the negative resist involves a drawback that it cannot be accommodated to the fabrication of semiconductors integrated to high degrees because it is developed with an organic solvent, so that it swells to a significant extent and its resolving power is hence limited. On the other hand, positive resist compositions are believed that they can be satisfactorily accommodated to the integration of semiconductors to a high degree because they are excellent in resolving power compared with the negative resist composition.

Positive resist compositions composed of a novolak resin and a quinonediazide compound have been generally used in this field to date.

However, satisfactory results as to various properties such as sensitivity, resolution, rate of residual film heat resistance and storage stability are not necessarily obtained from the conventional positive resist compositions. There has been a strong demand for enhancing the performance of the positive resist compositions. In particular, the sensitivity is important to enhance the productivity of semiconductors and there has hence been a strong demand for making a positive resist composition highly sensitive. In order to attain such an object, various kinds of additive have been separately added to the positive resist compositions comprising the novolak resin and quinonediazide compound as base components. As examples of compounds added for improving the sensitivity as described above, namely, sensitizers, may be mentioned nitrogen-containing hetero-cyclic compound such as halogenated benzotriazole derivatives (Japanese Patent Application Laid-Open No. 37641/1983) and cyclic acid anhydrides (Japanese Patent Publication No. 30850/1981). However, the addition of these sensitizers is accompanied by problems, for example, that there is little difference in solubility between exposed portions and unexposed portions of the resist compositions, so that their rates of residual film are lowered and their resolution is deteriorated, and their heat resistance is reduced due to the plasticizing effect of the novolak resin, which is caused by the sensitizers.

OBJECTS AND SUMMARY OF THE INVENTION

It is an object of this invention to provide a high-sensitivity positive resist composition, which can solve the above-described drawbacks of the prior art, is excellent in various properties such as sensitivity, resolution, rate of residual film, heat resistance and storage stability and is suitable, in particular, for use in minute processing to 1 μm or smaller in line width.

The object of this invention can be achieved by providing a positive resist composition comprising an alkali-soluble phenolic resin, a photosensitive agent formed of a quinonediazide sulfonic acid ester and at least one compound represented by the following general formula (I):

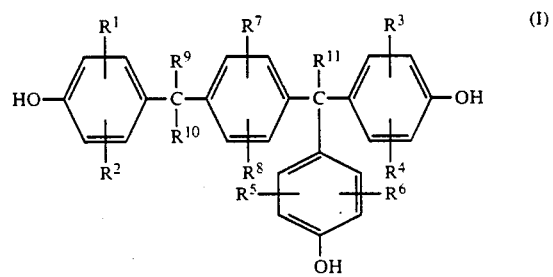

wherein
$R^1$ through $R^6$ mean individually a hydrogen or halogen atom, a hydroxyl group or an alkyl or alkenyl group having 1-4 carbon atoms and may be equal to or different from one another,
$R^7$ and $R^8$ denote individually a hydrogen or halogen atom, or an alkyl group having 1-4 carbon atoms and may be equal to or different from each other, and
$R^9$ through $R^{11}$ stand individually for a hydrogen atom or an alkyl group having 1-4 carbon atoms and may be equal to or different from one another.

DETAILED DESCRIPTION OF THE INVENTION

Alkali-soluble phenolic resin

As exemplary alkali-soluble phenolic resins useful in the practice of this invention, may be mentioned condensation products of a phenol and an aldehyde, condensation products of a phenol and a ketone, vinylphenol polymers, isopropenylphenol polymers and hydrogenation products of these phenolic resins.

As specific examples of the phenols usable herein, may be mentioned monohydric phenols such as phenol, cresol, xylenol, ethylphenol, propylphenol, butylphenol and phenylphenol; and polyhydric phenols such as resorcinol, pyrocatechol, hydroquione, bisphenol A and pyrogallol.

As specific examples of the aldehydes usable herein, may be mentioned formaldehyde, acetoaldehyde, benzaldehyde and terephthalaldehyde.

As specific examples of the ketones usable herein, may be mentioned acetone, methyl ethyl ketone, diethyl ketone and diphenyl ketone.

The condensation reactions of their corresponding compounds mentioned above can be separately performed in accordance with the conventional method such as bulk polymerization or solution polymerization.

The vinylphenolic polymer is selected from a homopolymer of vinylphenol and copolymers of vinylphenol and a component copolymerizable therewith. As specific examples of the copolymerizable component, may be mentioned acrylic acid, methacrylic acid, styrene, maleic anhydride, maleinimide, vinyl acetate, acrylonitrile and derivatives thereof.

The isopropenylphenolic polymer is selected from a homopolymer of isopropenylphenol and copolymers of isopropenylphenol and a component copolymerizable therewith. As specific examples of the copolymerizable component, may be mentioned acrylic acid, methacrylic acid, styrene, maleic anhydride, maleinimide, vinyl acetate, acrylonitrile and derivatives thereof.

The hydrogenation reactions of these phenolic resins can be separately effected by any optional known method. Described specifically, the reaction can be achieved by dissolving each of the phenolic resins in an organic solvent and then introducing hydrogen into the solution in the presence of a homogeneous or heterogeneous hydrogenation catalyst.

These alkali-soluble phenolic resins may be used after their molecular weight distributions are controlled by reprecipitation fractionation or the like, and may be used either singly or in combination.

For example, a copolymer of styrene and acrylic acid, methacrylic acid or maleic anhydride, a copolymer of an alkene and maleic anhydride, a polymer of vinyl alcohol, a polymer of vinylpyrrolidone, rosin, shellac and/or the like may be optionally added to the positive resist composition according to this invention in order to improve its developability, storage stability, heat resistance, etc. The amount of these optional components to be added is 0-50 parts by weight, preferably 5-20 parts by weight per 100 parts by weight of the alkali-soluble phenolic resin.

Photosensitive agent

No particular limitation is imposed on the photosensitive agent useful in the practice of this invention so long as it is a quinonediazide sulfonic acid ester.

The quinonediazide sulfonate can generally be synthesized by the esterification reaction of a compound having at least one —OH group and a quinone-diazide sulfonic compound, for example, by a method in which the quinonediazide sulfonic compound is reacted with chlorosulfonic acid to form a sulfonyl chloride and the thus-formed sulfonyl chloride is then condensed with the OH-containing compound in accordance with the conventional method.

As specific examples of the quinonediazide sulfonate usable in this invention, may be mentioned those whose ester moieties are respectively 1,2-benzoquinonediazide-4-sulfonate, 1,2-naphthoquinonediazide-4-sulfonate, 1,2-naphthoquinonediazide-5-sulfonate, 2,1-naphthoquinone-diazide-4-sulfonate, 2,1-naphthoquinonediazide-5-sulfonate and sulfonates of other quinonediazide derivatives.

No particular limitation is imposed on the OH-containing compound. As exemplary OH-containing compounds, may be mentioned cresol, xylenol, resorcine, catechol, hydroquinone, pyrogallol, fluoroglucinol, fluoroglucide, 2,3,4-trihydroxybenzophenone, 2,4,4'-trihydroxybenzophenone, 2,3,4,4'-tetrahydroxybenzophenone, 2,2'4,4'-tetrahydroxybenzophenone, 2,2',3,4,4'-pentahydroxybenzophenone, 2,2',3,4,5'-pentahydroxybenzophenone, 2,3,3',4,5'-pentahydroxybenzophenone, 2,3,3',4,4',5'-hexahydroxybenzophenone, 2,3',4,4',5',6-hexahydroxybenzophenone, methyl gallate, ethyl gallate, propyl gallate, 2,2-bis(4-hydroxyphenyl)propane, 2,2-bis(2,4-dihydroxyphenyl)propane, 2,2-bis(2,3,4-trihydroxyphenyl)propane, cresol novolak resins, resorcine-acetone resins, pyrogallol-acetone resins, polyvinylphenol resins and copolymers of vinylphenol. The quinonediazide sulfonates of these compounds are usable in this invention.

Although the photosensitive agents in this invention may be used singly, two or more of them may be used in combination. The proportion of the photosensitive agent is generally 1-100 parts by weight, preferably 3-40 parts by weight per 100 parts by weight of the alkali-soluble phenolic resin. If the proportion should be lower than 1 part by weight, the formation of any patterns will become impossible. On the other hand, if the proportion should exceed 100 parts by weight, the insolubilization of exposed portions will tend to occur upon developing.

Sensitizer

No particular limitation is imposed on the sensitizer useful in the practice of this invention so long as it is a compound represented by the general formula (I).

As specific examples of the compound represented by the general formula (I), may be mentioned the following compounds:

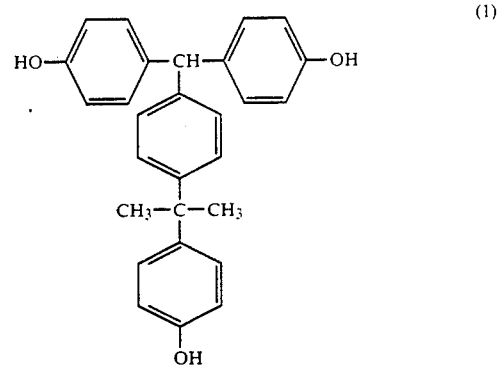

(1)

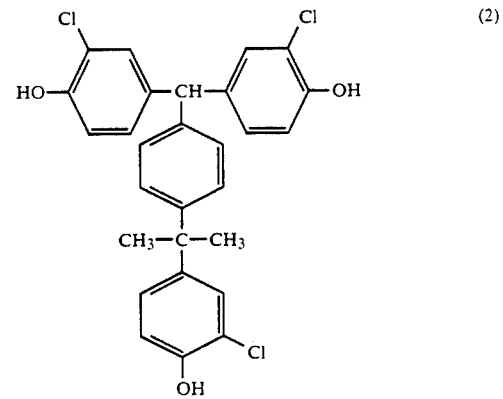

(2)

-continued
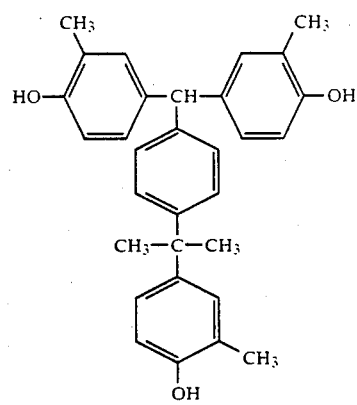 (3)
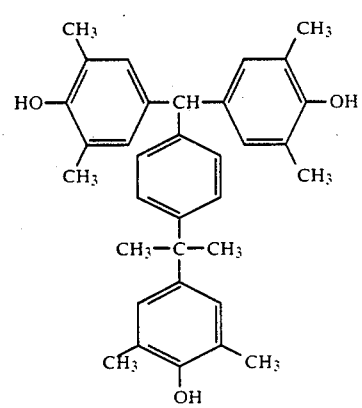 (4)
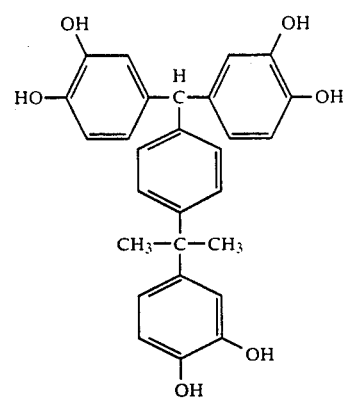 (5)
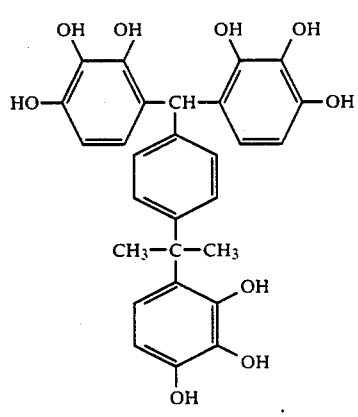 (6)
-continued
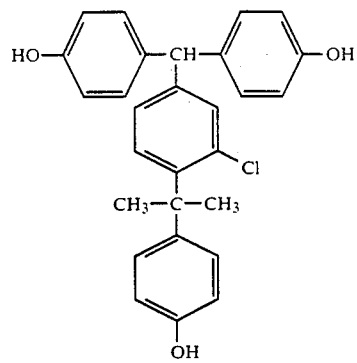 (7)
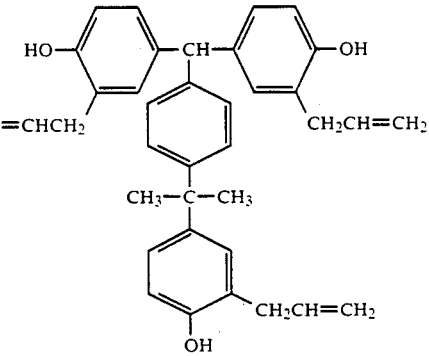 (8)
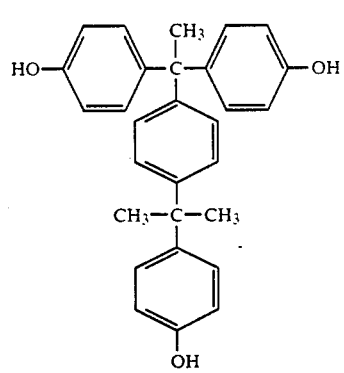 (9)
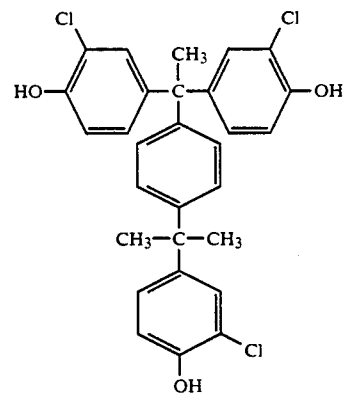 (10)

-continued
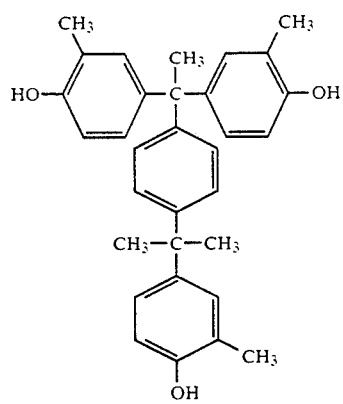 (11)
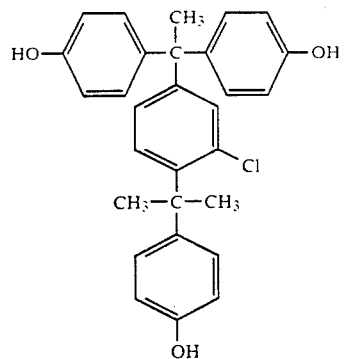 (15)
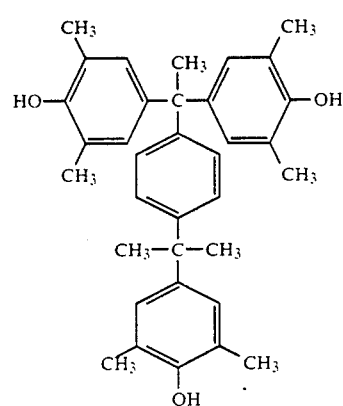 (12)
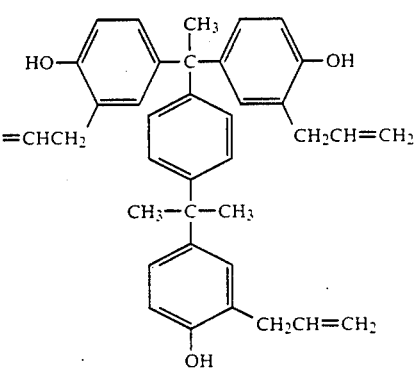 (16)
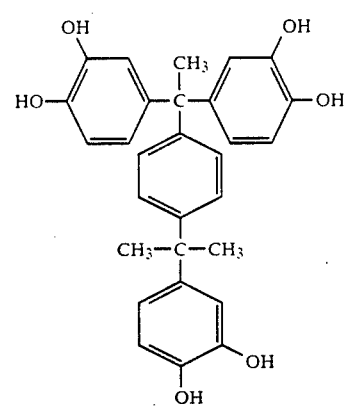 (13)
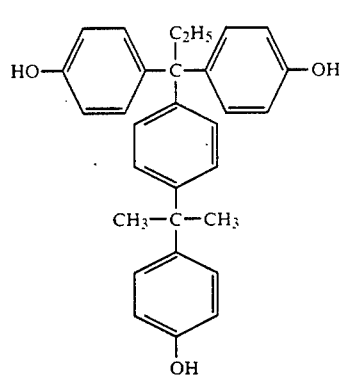 (17)
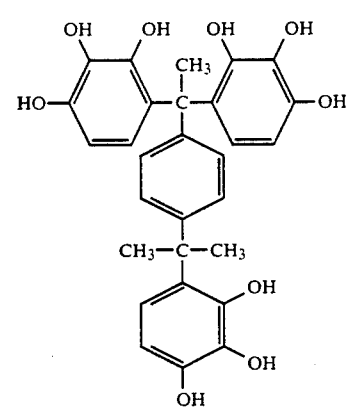 (14)
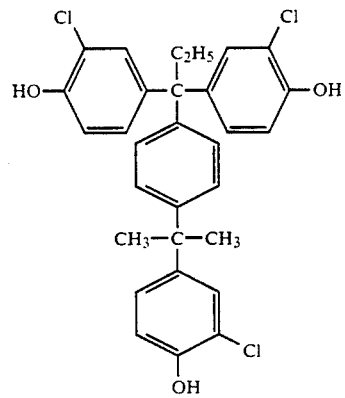 (18)

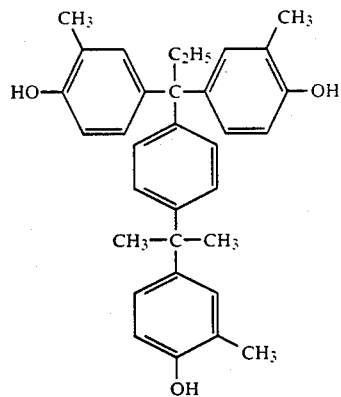 (19)

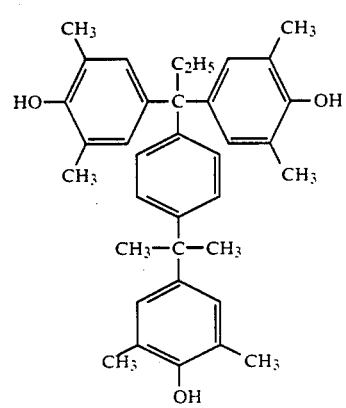 (20)

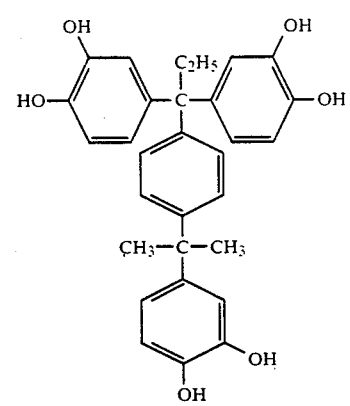 (21)

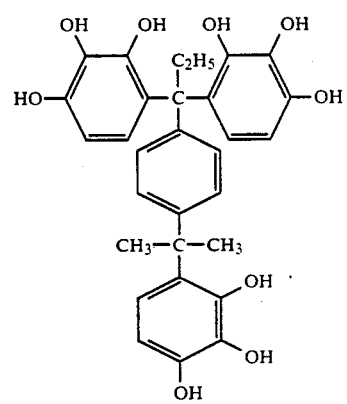 (22)

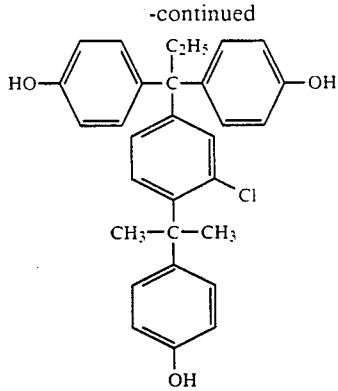 (23)

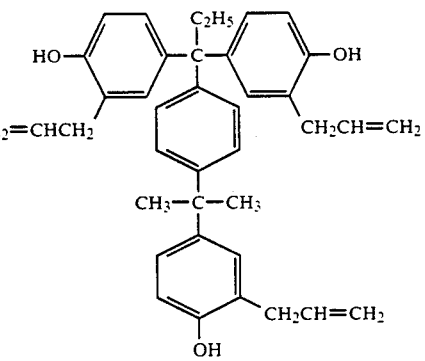 (24)

The sensitizers usable in this invention may be used either singly or in combination. The proportion of the sensitizer is generally 1-100 parts by weight, preferably 2-50 parts by weight per 100 parts by weight of the alkali soluble phenolic resin. If the proportion should exceed 100 parts by weight, the rate of residual film will be lowered to a significant extent and the formation of a pattern will become difficult.

. Other components

The positive resist composition according to this invention is used in a state that it is dissolved in a solvent. As exemplary solvents, may be mentioned ketones such as acetone, methyl ethyl ketone, cyclohexanone and cyclopentanone; alcohols such as n-propyl alcohol, isopropyl alcohol, n-butyl alcohol and cyclohexanol; ethers such as ethylene glycol dimethyl ether, ethylene glycol diethyl ether and dioxane; alcohol ethers such as ethylene glycol monomethyl ether and ethylene glycol monoethyl ether; esters such as propyl formate, butyl formate, propyl acetate, butyl acetate, methyl propionate, ethyl propionate, methyl butyrate, ethyl butyrate, methyl lactate and ethyl lactate; cellosolve esters such as cellosolve acetate, methylcellosolve acetate, ethylcellosolve acetate, propylcellosolve acetate and butylcellosolve acetate; propylene glycols such as propylene glycol, propylene glycol monomethyl ether, propylene glycol monoethyl ether, propylene glycol monomethyl ether acetate, propylene glycol monoethyl ether acetate and propylene glycol monobutyl ether; diethylene glycols such as diethylene glycol monomethyl ether, diethylene glycol monoethyl ether, diethylene glycol dimethyl ether, diethylene glycol diethyl ether and diethylene glycol methyl ethyl ether; halogenated hydrocarbons such as trichloroethylene; aromatic hydrocarbons such as toluene and xylene; and polar solvents such as dimethylacetamide, dimethylformamide and N- methylacetamide. These solvents may be used either singly or in combination.

In the positive resist composition according to this invention, may be contained one or more of compatible additives such as a surfactant, storage stabilizer, another sensitizer, anti-striation agent, plasticizer and anti-halation agent, as needed.

Developer

An aqueous solution of an alkali is used as a developer for the positive resist composition of this invention. As specific examples of the alkali, may be mentioned inorganic alkalis such as sodium hydroxide, potassium hydroxide, sodium silicate and ammonia; primary amines such as ethylamine and propylamine; secondary amines such as diethylamine and dipropylamine; tertiary amines such as trimethylamine and triethylamine; alcohol amines such as diethylethanolamine and triethanolamine; and quaternary ammonium salts such as tetramethylammonium hydroxide, tetraethylammonium hydroxide, trimethylhydroxymethylammonium hydroxide, triethylhydroxymethylammonium hydroxide and trimethylhydroxyethylammonium hydroxide.

If necessary, suitable amounts of a water-soluble organic solvent such as methanol, ethanol, propanol or ethylene glycol, a surfactant, a storage stabilizer, a dissolution inhibitor for the resin and/or the like may be added further to the aqueous alkali solution.

ADVANTAGES OF THE INVENTION

Since the positive resist composition according to this invention is excellent in sensitivity, resolution, rate of residual film, heat resistance, storage stability, etc., it is very useful in particular for minute processing to 1 μm or smaller in line width.

EMBODIMENTS OF THE INVENTION

The present invention will hereinafter be described more specifically by the following Examples. Incidentally, all designations of "part" or "parts" as will be used in the following Examples and Comparative Example mean part or parts by weight unless otherwise provided.

Examples 1-3 and Comparative Example 1

In 360 parts of ethyl lactate, were dissolved 100 parts of a novolak resin (an alkali-soluble phenolic resin) obtained by mixing m-cresol, p-cresol and 3,5-xylenol at a molar ratio of 50:20:30, adding formaline thereto and condensing them by a method known per se in the art using an oxalic acid catalyst, 28 parts of the quinonediazide sulfonate of 2,3,4,4'-tetrahydroxybenzophenone, in which the phenolic compound had been converted into the ester with 1,2-naphthoquinonediazide-5-sulfonic acid to an extent of 95%, and 5 parts of a compound (a sensitizer) represented by the formula (1). The resulting solution was filtered through a polytetrafluoroethylene (hereinafter abbreviated as "PTFE") filter having a pore size of 0.1 μm to prepare a resist solution (Example 1).

After applying the resist solution by a coater on a silicon wafer, the resist solution was baked for 90 seconds at 90° C., thereby forming a resist film having a thickness of 1.17 μm. The thus-formed resist film was exposed using a g-line stepper, "NSR-1505G6E" (manufactured by Nikon Corp., NA=0.54) and a test reticle. The thus-exposed film was then subjected to PEB (post-exposure baking) for 60 seconds at 110° C., followed by its development by the puddle process 1 minute at 23° C. in a 2.38% aqueous solution of tetramethylammonium hydroxide to obtain a positive pattern.

A resist solution was prepared in the same manner as in Example 1 except that a compound (a sensitizer) represented by the formula (11) was used to obtain a positive pattern (Example 2).

A resist solution was prepared in the same manner as in Example 1 except that a compound (a sensitizer) represented by the formula (14) was used to obtain a positive pattern (Example 3).

A resist solution was prepared in the same manner as in Example 1 except that no sensitizer was used to obtain a positive pattern (Comparative Example 1).

The wafers with the respective patterns formed thereon were taken out of the aqueous alkali solution to evaluate them. Evaluation results are shown in Table 1.

By the way, the film thickness of each pattern was measured by a thickness meter, "Alpha Step 200" (manufactured by Tenko Company). The resolution was evaluated by observing each width of lines and spaces resolved through an electron microscope.

TABLE 1

| | Sensitizer | Sensitivity mJ/cm$^2$ | Thickness of residual film μm | Resolution μm |
|---|---|---|---|---|
| Ex. 1 | Formula (1) | 110 | 1.12 | 0.45 |
| Ex. 2 | Formula (11) | 120 | 1.14 | 0.40 |
| Ex. 1 | Formula (14) | 100 | 1.12 | 0.45 |
| Comp. Ex. 1 | Not used | 160 | 1.13 | — |

EXAMPLE 4

In 400 parts of ethylcellosolve acetate, were dissolved 100 parts of a novolak resin (an alkali-soluble phenolic resin) obtained by mixing m-cresol and p-cresol at a molar ratio of 8:2, adding formaline thereto and condensing them by a method known per se in the art using an oxalic acid catalyst. The resulting solution was added dropwise into 3,000 parts of toluene to deposit the resin. After the thus-deposited novolak resin was collected by filtration, it was dried under reduced pressure for 30 hours at 60° C. In 380 parts of ethyl lactate, were dissolved 100 parts of the novolak resin thus vacuum-dried, 28 parts of the quinonediazide sulfonate of 2,3,4,4'-tetrahydroxybenzophenone, in which the phenolic compound had been converted into the ester with 1,2-naphthoquinonediazide-5-sulfonic acid to an extent of 95%, and 10 parts of a compound (a sensitizer) represented by the formula (9). The resulting solution was filtered through a PTFE filter having a pore size of 0.1 μm to prepare a resist solution.

After applying the resist solution by a coater on a silicon wafer, the resist solution was baked for 90 seconds at 90° C., thereby forming a resist film having a thickness of 1.17 μm. The thus-formed resist film was exposed using the g-line stepper, "NSR-1505G6E" and a test reticle. The thus-exposed film was then subjected to PEB for 60 seconds at 110° C., followed by its development by the puddle process 1 minute at 23° C. in the 2.38% aqueous solution of tetramethylammonium hydroxide to obtain a positive pattern.

The wafer with the pattern formed thereon was taken out of the aqueous alkali solution to evaluate its sensitivity. As a result, it was found to be 90 mJ/cm². The pattern was observed through an electron microscope. As a result, it was found that alternate lines and spaces were resolved at intervals of 0.45 μm. The film thickness of the pattern was measured by the thickness meter, "Alpha Step 200" and was found to be 1.12 μm.

EXAMPLE 5

In 320 parts of diglyme, were dissolved 100 parts of a copolymer of vinylphenol and styrene (at a molar ratio of 5:5) as an alkali-soluble phenolic resin, 36 parts of the quinonediazide sulfonate of "Trisphenol PA" (product of Mitsui Petrochemical Industries, Ltd.), in which the phenolic compound had been converted into the ester with 1,2-naphthoquinonediazide-5-sulfonic acid to an extent of 90%, and 5 parts of a compound (a sensitizer) represented by the formula (9). The resulting solution was filtered through a PTFE filter having a pore size of 0.1 μm to prepare a resist solution.

After applying the resist solution by a coater on a silicon wafer, the resist solution was baked for 90 seconds at 100° C., thereby forming a resist film having a thickness of 1.17 μm. The thus-formed resist film was exposed using an i-line stepper, "NSR-1505i6A" (manufuctured by Nikon Corp., NA=0.45) and a test reticle. The thus-exposed film was then subjected to PEB for 60 seconds at 110° C., followed by its development by the puddle process 1 minute at 23° C. in the 2.38% aqueous solution of tetramethylammonium hydroxide to obtain a positive pattern.

The wafer with the pattern formed thereon was taken out of the aqueous alkali solution to evaluate its sensitivity As a result, it was found to be 90 mJ/cm². The pattern was observed through an electron microscope. As a result, it was found that alternate lines and spaces were resolved at intervals of 0.50 μm. The film thickness of the pattern was measured by the thickness meter "Alpha Step 200" and was found to be 1.12 μm (rate of residual film: 95.7%).

EXAMPLE 6

In 380 parts of ethyl lactate, were dissolved 100 parts of a novolak resin (an alkali-soluble phenolic resin) obtained by mixing m-cresol and p-cresol at a molar ratio of 5:5, adding formaline thereto and condensing them by a method known per se in the art using an oxalic acid catalyst, 14 parts of the quinonediazide sulfonate of 2,3,4,4'-tetrahydroxybenzophenone, in which the phenolic compound had been converted into the ester with 1,2-naphthoquinonediazide-5-sulfonic acid to an extent of 95%, 18 parts of the quinonediazide sulfonate of "Trisphenol PA" (product of Mitsui Petrochemical Industries, Ltd.), in which the phenolic compound had been converted into the ester with 1,2-naphthoquinonediazide-5-sulfonic acid to an extent of 90%, and 10 parts of a compound (a sensitizer) represented by the formula (9). The resulting solution was filtered through a PTFE filter having a pore size of 0.1 μm to prepare a resist solution.

After applying the resist solution by a coater on a silicon wafer, the resist solution was baked for 90 seconds at 100° C., thereby forming a resist film having a thickness of 1.17 μm. The thus-formed resist film was exposed using the i-line stepper, "NSR-1505i6A" and a test reticle. The thus-exposed film was then subjected to PEB for 60 seconds at 110° C., followed by its development by the puddle process 1 minute at 23° C. in the 2.38% aqueous solution of tetramethylammonium hydroxide to obtain a positive pattern.

The wafer with the pattern formed thereon wa taken out of the aqueous alkali solution to evaluate its sensitivity. As a result, it was found to be 120 mJ/cm². The pattern was observed through an electron microscope. As a result, it was found that alternate lines and spaces were resolved at intervals of 0.40 μm. The film thickness of the pattern was measured by the thickness meter, "Alpha Step 200" and was found to be 1.14 μm.

We claim:

1. A positive resist composition comprising in admixture:
   (i) 100 parts by weight of an alkali-soluble phenolic resin;
   (ii) 1–100 parts by weight of a photosensitive agent formed of a quinonediazide sulfonic acid ester;
   (iii) 1–100 parts by weight of at least one compound represented by the following general formula (I):

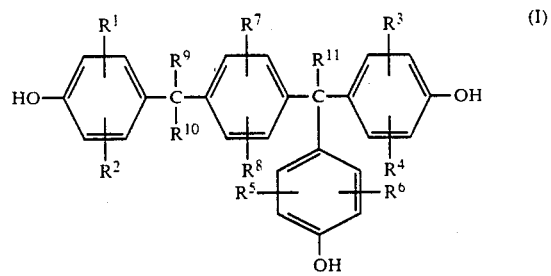

wherein
   $R^1$ through $R^6$ mean individually a hydrogen or halogen atom, a hydroxyl group or an alkyl or alkenyl group having 1–4 carbon atoms and may be equal to or different from one another,
   $R^7$ and $R^8$ denote individually a hydrogen or halogen atom, or an alkyl group having 1–4 carbon atoms and may be equal to or different from each other, and
   $R^9$ through $R^{11}$ stand individually for a hydrogen atom or an alkyl group having 1–4 carbon atoms and may be equal to or different from one another; and
   (iv) sufficient solvent to dissolve the foregoing composition components.

* * * * *